United States Patent [19]

Holtzman et al.

[11] Patent Number: 4,790,912

[45] Date of Patent: Dec. 13, 1988

[54] SELECTIVE PLATING PROCESS FOR THE ELECTROLYTIC COATING OF CIRCUIT BOARDS WITHOUT AN ELECTROLESS METAL COATING

[75] Inventors: Abraham M. Holtzman, Bat Yam; Joseph Relis, Ramat Gan, both of Israel

[73] Assignee: Techno-Instruments Investments Ltd., Bta-Yam, Israel

[21] Appl. No.: 931,176

[22] Filed: Nov. 14, 1986

Related U.S. Application Data

[63] Continuation-in-part of Ser. No. 872,093, Jun. 6, 1985.

[51] Int. Cl.$^4$ ................................................ C25D 5/02
[52] U.S. Cl. .................................. 204/15; 204/20; 204/38.4; 204/30; 204/32.1; 106/1.11; 427/304; 427/305; 427/306; 502/100
[58] Field of Search .............. 204/30, 20, 22, 15, 204/38.4, 32.1; 106/1.11; 427/304–306; 502/100

[56] References Cited

U.S. PATENT DOCUMENTS 3,099,608  7/1963  Radousky et al. .................. 204/15
3,930,963  1/1976  Polichette et al. .................. 204/20

OTHER PUBLICATIONS

"Electroplating", F. A. Lowenkein, McGraw Hill, pp. 422–423, 1978.

*Primary Examiner*—R. L. Andrews
*Attorney, Agent, or Firm*—Scully, Scott, Murphy & Presser

[57] ABSTRACT

A process is disclosed for selectively electrometallizing a non-conductive substrate such as the non-conductive surfaces of a circuit board and to directly effect through hole plating and/or form circuits of the boards without employing an electroless metal coating.

A photoresist is employed in the process which is exposed, developed and neutralized prior to electrometallizing the substrate. Selectivity is obtained by neutralization.

Metals are deposited on a non-conductive substrate in the process by using the reductive capacity of hydrogen in the presence of a metal catalyst of the substrate. The metal catalyst is combined with hydrogen that is generated electrolytically from a protic bath. The metal catalyst combined with hydrogen is contacted with a metal salt. The metal salt may be combined with the protic bath so that the hydrogen that is generated electrolytically combines with the metal catalyst and the metal salt is converted to a metal coating on the substrate.

43 Claims, No Drawings

SELECTIVE PLATING PROCESS FOR THE ELECTROLYTIC COATING OF CIRCUIT BOARDS WITHOUT AN ELECTROLESS METAL COATING

RELATION TO OTHER APPLICATIONS

The present invention is a continuation-in-part appliaation of U.S. patent application, Ser. No. 872,093, filed June 6, 1985.

DESCRIPTION

1. Technical Field

The field of the invention is a selective plating process employing a photo sensitive film for the electrometalization of non-metallic substrates without utilizing an electroless metal coating. In one embodiment the invention relates to circuit boards and a method for improving the manufacture of such boards by selectively plating the boards through an imaged photoresist film that has been neutralized. The electroless plating of such boards is eliminated in such process which also includes effecting through hole plating and/or directly forming circuits on the circuit board by an electrolytically deposited metal coating.

2. Prior Art

Morrissey et al. U.K. Pat. No. 2,123,036 and Radovsky et al. U.S. Pat. No. 3,099,608 describe methods for electroplating non-metallic surfaces but do not disclose processes for selectively coating the surface with an imaged photoresist.

Strickland et al., U.K. Pat. No. 1,222,969 describe a plating process for the application of a metal coating to a non-metallic substrate by means of an electro/electroless plating solution. The substrate is immersed in the plating solution until a metal deposit has been formed by an electroless plating process. The substrate is then made cathodic and electro-plated from the same plating solution until the desired thickness of deposit is obtained.

Peach, U.S. Pat. No. 3,303,111 describes a process and composition for the electro-electroless plating of metal substrates. A small electric current which may be either direct or alternating is employed to speed up the deposition of nickel or nickel-phosphorous alloys on a metal workpiece immersed in a bath containing a nickel salt and a hypophosphite such as sodium hypophosphite.

SUMMARY OF THE INVENTION

The present invention relates to a selective plating process employing photoresist film which is imaged and neutralized prior to the electrometallization of a non-conductive substrate by a process using the reductive capability of hydrogen. A photoresist film is placed on the substrate, imaged and neutralized to leave openings in the photoresist after which a metal (referred to hereafter as a metal catalyst) is placed on the substrate through the imaged areas that are opened. The metal catalyst has the ability to combine with hydrogen. Hydrogen is then generated electrolytically from a protic bath in which the substrate and metal catalyst is immersed and combines with the metal catalyst. The combination of hydrogen with the metal catalyst includes inter alia the formation of a hydride with the metal catalyst and/or the formation of a solid solution of hydrogen in the metal latice of the metal catalyst and/or adsorption of hydrogen on the metal catalyst. A metal, referred to hereafter as the coated metal is then deposited on the substrate previously coated with the metal catalyst combined with hydrogen. The coated metal is deposited from a metal salt and preferably is present in the protic bath from which hydrogen is generated electrolytically. The coated metal is only applied on the substrate through the openings in the imaged and neutralized photoresist film and not on the photoresist film because of the step employed to neutralize the film.

The films employed in this respect are those that are developed by an alkaline developer and are known in the art as well as the art-known equivalents thereof. Films that can be developed by aqueous or semi-aqueous developers are preferred.

The process of combining the hydrogen with the metal catalyst is enhanced by contacting the metal catalyst with various promoters such as water soluble polymers, organic hydroxy compounds, surfactants, thiourea compounds, amino acids, polycarboxylic acids and various combinations thereof. The metal catalyst is combined with the promoter by applying the promoter to the non-conductive substrate prior to, simultaneously with or subsequent to the application of the metal catalyst to the non metallic substrate. A promoter may also be applied by any combination of steps i.e. prior to, simultaneously with, and subsequent to the, application of the metal catalyst to the non-conductive substrate.

The catalyst is preferably employed as an aqueous system and optionally contains a stabilizer that minimizes the catalyst's sensitivity to water. The stabilizer comprises a metal salt such as aluminum chloride, aluminum chlorohydrate and various equivalents thereof.

The present invention also relates to a novel method for plating circuit boards and to effect through hole plating and/or to directly form circuits thereon by an electrolytically deposited metal coating without employing an electroless metal coating by using the process and composition previously described.

In one embodiment, a non-metallic substrate such as the dielectric surfaces of a circuit board is coated in three steps, the first step comprising immersing the substrate into a cleaner/conditioner, the second step comprising applying a metal catalyst composition to the cleaned and conditioned substrate and electrolytically coating the substrate with a metal plating composition. The clearner/conditioner in this aspect of the invention comprises:

(a) a chelating agent (promoter);
(b) a fluoride salt;
(c) a thiourea compound (promoter);
(d) a surfactant (promoter) selected from a member of the group consisting of nonionic, cationic, anionic, and amphoteric surface active agents;
(e) an acid;

to obtain a cleaned and conditioned substrate or board.

A catalyst is then applied to said cleaned and conditioned substrate or board comprising:

(a) a metal catalyst which can combine with hydrogen;
(b) an acid;
(c) a salt of $Sn^{+2}$;
(d) a member selected from the group consisting of an alkali metal stannate and a salt of $Sn^{4+}$;
(e) a stabilizer such as a metal salt that can be hydrolyzed to yield a metal hydroxide precipitate having a pK lower than $SnOHA_{n_1}$ where $An_1$ is a monovalent anion;
to obtain a catalyzed substrate such as a circuit board.

The catalyzed substrate such as a circuit board is then electrolytically coated with a metal plating composition or bath comprising:
(a) a metal salt;
(b) an acid;
(c) an adjuvant (promoter) selected from a member of the group consisting of
   (i) polyhydroxy cyclic compounds especially those in which at least two hydroxyl groups are separated by one carbon atom;
   (ii) acetylenic alcohols and their derivatives
   (iii) acetylenic compounds and
(d) a halogen ion.

The foregoing process and composition result in the electrometallization of the non-metallic substrate or circuit board without an electroless metal coating being formed, contrary to the process of Strickland et al.

Prior to or after applying the cleaner/conditioner to said board, a photoresist is applied to the board, exposed, developed and neutralized to form a circuit pattern on the board followed by the foregoing steps of applying the catalyst and electrolytically coating the board. Optionally the board may be polarized during the electrolytic coating process, especially where the photoresist film comprises an aqueous alkali soluble resist film.

The photoresist may also be applied and developed according to the invention followed by the application of an etch resist such as an immersion coating to the metal areas exposed through the photoresist. The photoresist is then stripped and the remainder of the metal surface that does not have the immersion coating applied to it is stripped or etched thereby leaving a circuit pattern on the board. The immersion coating may comprise a tin immersion coating.

The process therefore is especially effective for plating such boards and to directly effect through hole plating of the boards and/or form circuits thereon by an electrolytically deposited metal coating without an electroless metal coating.

DETAILED DESCRIPTION

Printed Circuit Boards

The present invention relates to a novel method in the formation of metal coatings on non-metallic substrates such as in the manufacture of printed circuit boards. Printed circuit boards (PCB's) comprise a non-conducting or dielectric base made up of a fibrous maerial such as glass fibers, paper and the like, layer such as copper on either one or both surfaces. Multilayer boards (MLB's) comprise several PCB's laminated to one another by means of an adhesive. In addition to rigid boards (as described above), flexible boards can be produced employing thermoplastic dielectric layers such as fluorocarbon polymers, Nylon polymers, polyimides, Kevlar (trademark) reinforced polymers, polyparabanic acids, and polyesters. Flexible boards are manufactured without fiber reinforcing. Production of these types of printed circuit boards are described in *Printed Circuits Handbook*, Second Edition, edited by C. F. Coombs, Jr. McGraw-Hill, 1979, which is incorporated herein by reference. Laminated combinations of flexible and rigid boards are also finding utility in some more recent applications for MLB's. The present invention applies to all of these structures and the formation of metal coatings on non-metallic substrates such as the foregoing resinous materials or polymers as well as ceramic substrates.

Any non-metallic substrate may be employed that will absorb, adsorb or have the catalyst as described herein adhered to it either directly or with the aid of a promoter employed to coat the substrate or which may be incorporated in the substrate.

In the manufacture of PCB's, a metal conductive foil such as copper is bonded to the circuit board, although for the purposes of the present invention any metal may be applied to a non-conductive dielectric circuit board as a foil, by electro deposition or electroless deposition.

Prior to laminating PCB's to form an MLB, the metal surface is treated in an art known manner to produce electrically conductive lines (circuits) for the transfer of current between components of an electrical circuit, the components comprising by way of example, diodes, transistors, resistors, capacitors, and the like. The circuits may be formed either by a positive or a negative working photo resist, silkscreen resist, or hand painted resist process followed by etching and in some instances, electrodeposition of a metal or metals, all of which is known in the art.

The circuits of the PCB's (the inner layers of an MLB) are usually formed by a print and etch process in which a positive working photo resist is applied to the metal layer, a positive circuit image projected onto the resist, followed by a developing process to leave a positive resist pattern. The positive resist pattern can also be formed by a negative working photo resist through which a negative circuit image is projected. The board is the etched after which the positive resist is removed. The elements of the circuit obtained do not have to be electrically connected to one another. These circuits elements hat are not connected are placed on the PCB for subsequent connection to other circuit layers in the MLB array.

Multilayer Boards—MLB's

In forming MLB's by laminating, an adhesive in the form of a prepreg is inserted between the surfaces of the PCB's that are to be laminated after which the multilayers are further treated by applying heat and pressure to them. The prepreg generally comprises a woven or non-woven layer or layers of fibers such as glass, cellulose (e.g., paper), and the like, glass being preferred. The prepreg also is impregnated with a so-called "B-stage" resin such as an epoxy resin that has been partially cured. Art known equivalents of epoxy resins are also employed as adhesives such as acrylic resins (used with polyimide circuit boards) or polyester resins.

In laminating the individual circuit boards (PCB's) to form the MLB, the individual PCB's are assembled in an MLB array, placed in a press that is heated to 175° C., held there for about 10–15 minutes to bring the MLB array up to temperature after which a pressure of 250–400 psi is applied. The MLB array is held at this temperature and pressure for approximately 45–50 minutes after which heating is stopped and the MLB thus formed allowed to cool for about 10–15 minutes while in the press. After this cooling period, the pressure is released and the MLB is removed from the press.

One of the difficulties encountered in the prior art manufacture of MLB's is the low bonding strength sometimes obtained between the prepreg and the metal surface of a circuit board in the array of boards that make up the MLB. These problems are especially prevalent when the metal layer comprises copper. The bonding between the copper clad board and the prepreg was improved by etching the copper with amonium persulfate; however, only slightly better bonding strengths were obtained. Some improved adhesion over the etching process was obtained by pumice spraying to micro-etch the copper surface or provide cavities in the copper surface to which the resin such as the epoxy resin of the prepreg could be bonded to. Other mechanical processes such as brushing similarly provided a mechanical alteration of the surface of the copper to improve the bond strength.

Even better bond strengths between the copper layer and the prepreg were obtained with a so-called black oxide coating in which the copper surface of a PCB was treated with a mixture of sodium hypochlorite and sodium hydroxide to produce a black copper oxide. Prior to the formation of the black oxide coating, the copper surface had to be prepared by brushing, rinsing, and etching either with amonium persulfate or a sulfuric acid - hydrogen peroxide mixture.

It was subsequently discovered that by lowering the sodium hypochlorite/sodium hydroxide bath temperature from 90°-95° C. to 60°-65° C. some economies could be realized in that less heat had to be supplied to the bath, but more importantly the process was easier to control. By employing temperatures of from about 60°-65° C. a bronze or brown colored copper oxide layer was produced on the surface of the copper and slightly better bond strengths were obtained.

Connecting MLB's (a) through hole formation

In MLB's, the circuit of one board is connected to the circuit of one or more of the other boards in the multilayers. This is achieved by forming pads or circular areas of metal at a point or points on the conductive line or lines of the board. The pads may also be isolated from the conductive lines. The other board or boards that are to be connected are similarly provided with pads and in the laminating process the pads of the different boards are aligned over one another.

The MLB is then pressed and cured after which the pads of the MLB's are drilled to form through holes. The diameter of the drill is considerably less than the diameter of the pad, the ratio of diameters between the pad and the drill being about 2:1 or greater so that the overall structure comprises at a minimum a pad from one board aligned over a pad from another board with a through hole passing through them. Since the through hole in cross-section ideally presents a surface of alternating layers of the pads of the individual PCB's separated by the non-conductive base, an electrically conductive element has to be employed in the hole to form an electrical connection between the pads. This is done by a process known in the art as through hole plating (PTH).

PTH processes are also employed for connecting two metal conductive surfaces having a single non-conductive or dielectric board interposed between them for the formation of a PCB. Boards of this type and the formation of through holes in such boards are also within the scope of the present invention and are intended to be included within the broad definition of the MLB's as that term is used throughout the seecification. (b) smear removal Before the PTH process can be undertaken in the MLB, any "smear" in the hole must be removed.

Smearing is a difficulty encountered in the manufacture of MLB's whereby the drill bit employed to form the hole through the aligned pads in an MLB picks up resinous material and deposits this material on the wall of the hole. Since the wall of the hole contains alternating resinous material layers and metal layers, the surface of the metal layers that form part of the hole wall will be coated with the resinous material thereby preventing any metallic plating material applied to the surface of the hole wall from contacting the metal layers and forming an electrically conductive connection with it. It is believed that the resinous material such as a B-stage epoxy resin used in the prepreg comprises the principle material involved in the smearing of the hole. Smearing, therefore, renders the PTH process ineffective.

The problem of smearing is overcome by a process known in the art as chemical cleaning in which a strong mineral acid such as sulfuric acid (optionally containing some hydrofluoric acid used in an "etch-back" process) is used to etch away the "smear" from the wall of the hole. Hydrofluoric acid is added to the sulfuric acid to remove any glass fibers from the circuit board that might be projecting into the hole. The glass fiber ends come from the glass fiber employed in the manufacture of the circuit boards or prepreg and are removed since they cause imperfections in the surface of the metallic coating applied by the PTH process.

The etch-back process requires very careful control in order to prevent excessive etching of the wall of the hole. The concentration and temperature of the etching solution has to be carefully monitored as well as the length of time over which the etching process is conducted.

Precise control of the degree of chemical cleaning or etch-back is critical in order to obtain an acceptable metal coating on the wall of the through hole. In some instances in the chemical cleaning or etch-back process, the etching solution will remove the resinous layer of the MLB to a greater degree than the metal or copper layers in the hole. This will result, after ctching, in the metal layers projecting slightly beyond the wall of the hole as defined by the surface of the resinous material. If this metal layer projection is excessive, the metal coating applied to the wall of the hole by the PTH process will be uneven and will not make proper electrical contact with the metal layers in the hole.

The phenomenon of the metal layer being etched at a faster rate than the resinous layer in the hole is known as "reverse etch" which in some instances presents the same type of problem encountered where the metal layer projects too far into the hole after etching.

(c) throuhh hole plating (PTH)

After smear is removed, the through hole is plated. Electroless copper is employed as a PTH plating material. Standard electroless copper plating solutions known in the art are used for this purpose. In order to promote the deposition of electroless copper on a non-conductive surface, the non-conductive surface is treated with a stannous chloride sensitizer solution followed by a super sensitizer solution of di-valent palladium chloride. The stannous chloride is oxidized to stannic chloride and the palladium chloride reduced to palladium metal.

A preferred method is to employ an activator comprising colloidal palladium containing stannic tin. Stannic tin forms a protective colloid around the metallic palladium, and the solution implants a precious metal site on the non-conductive surface for the purpose of initiating the deposition of the copper by chemical reduction. A post activator is then employed, generally an acid, to solubilize the protective colloid and expose the precious metal, i.e. palladium.

The subsequently applied electroless copper coating solution contains cupric ions and a reducing agent such as formaldehyde, which reduces the cupric ions in the solution to copper metal when in the presence of palladium. The copper metal plates out on the surface of the through hole, making electrical contact with the walls of the metal pads through which the hole is drilled as well as the copper surface on the outer layer(s) of the MLB. The electroless copper may have subsequent metal coatings applied to it by electrolytic means.

Outer Layer Circuit Formation

After the PTH process is completed, a circuit is formed on the outer layer of the MLB. Because the outer conductive metal layer of an MLB is formed as part of the PTH process, a print and etch procedure cannot be employed for forming ciruuits on this layer. The etching step would remove the plating applied in the through holes and would be self-defeating. For this reason, after the PTH process is completed, a negative circuit pattern is formed on the surface of the MLB by means of a negative working photo resist, followed by projecting a positive circuit image onto the resist and developing. This leaves a negative photo resist circuit pattern on the board with bare metal exposed corresponding to the area of the circuit. The negative resist pattern can also be obtained by a positive working photo resist through which a negative circuit image is projected.

In commercial operations, the bare metal corresponding to the circuit is then coated through the openings in the mask by electrolytic means with copper which also builds up the thickness of the copper on the walls of the through hole. In many instances, especially where a photoresist developed by an aqueou or a semi-aqueous developer is employed, the resist is also plated with the metal which is detrimental to the process since when the resist, plated with metal is stripped from the circuit board, it also, in some instances will cause the electrodeposited film on the exposed circuit board to be pulled away from the circuit board where the coating on the circuit board extends onto the resist. When the resist is not stripped, it may cause short circuiting of the board if it is coated with the metal coating. Avoiding this problem of electroplating on the resist is generally described as selective plating.

This electroplating is followed by electrolytically applying a second metal that acts as an etch-resist. Tin-lead alloys are the most common material used in this respect. The etch resist coating also coats the metal surface applied to the through holes in the PTH process. The photo resist is then removed and the board is etched resulting in the formation of a circuit on the outer layer of the MLB having a tin lead coating on the circuit as well as on the walls of the through hole.

Immersion Tin Coatings

The use of immersion tin coatings for plating metal surfaces does not employ an electric current but is based on an electro chemical displacement reaction. The metal substrate that is to be plated generally is more active (less noble) than the metal salt that is dissoved in the coating composition or plating solution. Copper may be plated by a tin solution even though copper is more noble than tin when the immersion coating composition is acidic and contains thiourea as a so-called "complexing" agent. It has been theorized that the relative electrode potentials of tin and copper are reversed under acidic conditions. Once the metal substrate is completely coated, it is no longer available to displace the metal ions in the immersion coating composition. Immersion tin coatings may be employed in lieu of the electrolytically applied tin-lead etch resist coatings.

Commercial Process for Connecting MLB's and Outer Layer Circuit Formation

In commercial operations, th connection of the MLB's by the formation of through holes, smear removal, through hole plating followed by the outer layer circuit formation is more complex. Commercial processes at the present time involve a 15 step procedure that may take anywhere from approximately two to approximately three hours, depending on whether a "low-build" or "hi-build" coating is deposited. In the former, only electroless copper is appiied in the PTH process whereas in the latter the electroless copper PTH coating step is followed by an electrolytic copper coating step.

Step 1:

In most commercial operations the outer layer of the MLB is generally copper-clad. After the through holes are drilled and smear is removed, a cleaner/conditioner is applied to the MLB to clean the copper surface and to condition the glass/epoxy in the through holes for better absorption of the catalyst that is subsequently applied to the through holes.

Step 2:

The MLB is then microetched by art known methods to activate the copper surface so as to provide a better bond between the electroless copper to be applied subsequently to the copper-clad surface.

Step 3:

A pre-catalyst is then applied to the MLB, the pre-catalyst being designed to eliminate any hydrolysis of the catalyst, which would result from carryover of water into the catalyst and which in turn would cause the catalyst to decompose.

Step 4:

A catalyst is then applied to the MLB, the catalyst generally comprising a colloidal palladium complex with tin and is designed to activate the glass/epoxy in the holes for post-metalization by electroless copper as described above.

Step 5:

After application of the catalyst, the MLB is then subject to an accelerator/post-catalyst composition which is designed to remove the tin surrounding the active palladium catalyst particles, resulting in a more active surface for the purpose of obtaining a shorter initiation time of the electroless copper coating. The accelerator/post-catalyst treatment is also designed to remove the excess of catalyst and prevent carryover of the catalyst into the electroless copper solution which would reduce the stability of that solution.

Step 6:

An electroless copper salt solution containing an organic compound that acts as a reducing agent is then applied to the MLB to metalize the non-conductive surfaces in the throughholes and convert them to conductive surfaces. The palladium catalyst previously applied promotes the reduction of the copper salt in the copper salt solution to form a coating of copper metal on the walls of the through hole.

Step 7:

The MLB is then dipped into a bath of 10% sulfuric acid which prevents discoloration of the copper surface by oxidation or, alternatively, to activate the copper surface prior to the application of electrolytic copper and thereby provide a good bond between the electroless and the electrolytic copper.

Step 8:

The MLB is then subject to electrolytic copper plating especially where a low-build electroless copper process was employed. The electrolytic copper plating improves the ductility, reduces the porosity and increases the thickness of the electroless copper plating especially on the non-conductive areas such as the through-holes. The electrolytic copper plating process also is designed to minimize or eliminate voids in the electroless copper coating.

Step 9:

A photosensitive dry film is then applied to the outer layer of the MLB and a circuit pattern diagram is formed and developed as described previously. The developed film not only defines the circuit but also acts as a plating resist when the etch resist tin-lead coating is subsequently applied to the circuit.

Step 10:

The MLB is then immersed in an acid cleaner which is designed to remove all traces of grease, contamination and resist residues and also to prepare the surface for a uniform microetch.

Step 11:

The MLB is then microetched to activate the copper surface for the purpose of improving the copper-to-copper bond when the MLB is subsequently coated with electrolytic copper.

Step 12:

The MLB is then dipped into a 10% sulfuric acid solution which is designed to remove any residual precipitates from the microetch process, especially as the copper concentration in the microetch increases with time.

Step 13:

The MLB is then electrolytically coated with copper to further build the overall copper thickness and to give a more ductile copper deposit.

Step 14:

The MLB is then dipped into a 5% solution of fluoboric acid to remove any traces of brightener residues from the electrolytic copper applied in the previous step, these brighteners sometimes causing contamination problems in the tin-lead coating subsequently applied as an etch resist. It has been discovered that traces of brightener in some instances cause localized de-wetting of the tin-lead coating. The fluoboric acid dip also activates the copper surface to achieve an effective metal-to-metal bond with the tin-lead etch resistant coating to be applied subsequently and to improve the compatability between the surface and the solution make-up. If non-fluoborate tin-lead solutions are employed for the electrolytic application of the tin-lead etch resist, this acid dip stage would not leave a residue that would contaminate the tin-lead solution since the fluoboric acid is an acid that is compatable with the non-fluoborate tin-lead electrolytic coating solution.

Step 15:

An electrolytic tin-lead deposit (as described previously) is then applied to the MLB as an etch resist.

Wave Soldering

After the PTH coating process and circuit formation on the outer layer of an MLB is completed the board has to be treated by two additional processing steps if it is to be subjected to wave soldering. In wave soldering, the wire leads of components of the circuit, such as resistors, capacitors, transistors, diodes and the like are inserted into and through the through holes in the board so that the ends of the wire leads project out of the through holes at the outer layer of the board. The outer layer of the board is then continuossly moved against a moving wave of molten solder thereby joining the lead ends to the pads that they project through. Since all metal surfaces on the bottom of the board (i.e., conductor lines in addition to pads and leads) come in contact with the molten solder wave in the wave soldering step, excessive amounts of solder would be applied to the board adding not only to its weight (which could be an adverse factor if the board is used in aircraft electronic systems) but also the cost. For this reason, a solder mask is placed over the outer layer of the board prior to the wave soldering process.

A solder mask comprises a photosensitive film (similar to the photoresist) which is exposed and developed to selectively remove areas of the film over those portions of the circuit to which solder is to be applied. The solder mask remains on the bottom layer of the board in the wave soldering operation and prevents the application of solder to areas of the circuit that do not require soldering.

One of the difficulties encountered with using the solder mask is that it is placed against the outer layer of an MLB on which the electrolytically deposited tin lead coating is employed as an etch eesist. The tin lead etch resist flows at the soldering temperatures and bubbles are also formed under the mask under these conditions. This causes the mask to shift during the soldering process. As a result, the openings of the mask are no longer in registration with the areas of the circuit board to which solder has to be applied which results not only in circuit components not being soldered into the board but also short circuiting of various conductor lines on the board.

In order to overcome this problem, the electrolytically deposited tin lead etch resist coating is removed in a separate step prior to the application of the solder mask by reflowing it at elevated temperatures. Since the removal of the electrolytically deposited tin/lead coating is not always uniform (i.e., the tin/lead coating remains on the circuit at uneven thicknesses) the circuit board sometimes has to be subjected to a leveling process. This comprises passing the board over a hot air knife, i.e., a constricted elongated hot air jet. Thus, additional processing steps are required in order to overcome the problems with the solder mask shifting during the wave soldering operation.

It is, therefore, an object of the present invention to overcome these and other difficulties encountered in the prior art.

It is also an object of the present invention to provide a process for selectively plating a metal on a non-conductive substrate using the reductive capacity of hydrogen in the presence of a metal catalyst on the substrate wherein the metal catalyst can combine with hydrogen, the hydrogen being generated electrolytically from a protic bath.

It is also an object of the present invention to provide a process as described heretofore in which a promoter is used in combination with the metal catalyst, the promoter functioning to enhance the metal catalyst's combining with hydrogen that is generated electrolytically from a protic bath.

It is also an object of the invention to provide a method for selectively electro-metallizing a non-metallic substaate without forming an electroless coating on the substrate.

It is a further object of the present invention to provide a novel method for plating circuit boards and to effect through hole plating of the board and/or directly form circuits thereon by an electrolytically deposited metal coating without an electroless metal coating.

It is a further object of the present invention to provide a novel cleaner/conditioner that may be employed in the aforementioned process.

It is an additional object of the present invention to provide a novel metal catalyst in the aforementioned process.

It is also an object of the present invention to provide a novel stabilizer for the metal catalyst in the aforementioned process.

It is also an object of the present invention to provide a novel metal plating bath such as a copper plating bath in the aforementioned process.

It is also an object of the present invention to reduce the number of steps in the plating of circuit boards in the aforementioned process.

It is a further object of the present invention to reduce the number of steps in plating a circuit board and to employ a novel tin immersion coating in said process.

These and other objects have been achieved according to the present invention.

The present invention relates to a process for the selective electrometallization of a non- conductive substrate by using the reductive capacity of hydrogen. A metal (referred to hereafter as a metal catalyst) is placed on the substrate, the metal catalyst having the ability to combine with hydrogen. Hydrogen is then generated electrolytically from a protic bath in which the substrate and metal catalyst is immersed and combines with the metal catalyst. A metal, referred to hereafter as the coated metal, is then deposited on the substrate previously coated with the metal catalyst combined with hydrogen. The coated metal is deposited from a metal salt and preferably is present in the protic bath from which hydrogen is generated electrolytically.

The process of combining the hydrogen with the metal catalyst is enhanced by contacting the metal catalyst with various promoters such as water soluble polymers, organic hydroxy compounds, surfactants, thiourea compounds, amino acids, polycarboxylic acids and various combinations thereof.

The various promoters that are described herein can act in a variety of ways to enhance the ability of the metal catalyst to combine with hydrogen that is generated electrolytically from a protic bath as described herein for example either by promotion of the so-called Volmer reaction or suppression of the so-called Tafel reaction; or the adhesion to or combination of the metal catalyst with the non-metallic substrate; or the polarization of the substrate during that part of the process wherein hydrogen is being generated electrolytically from the protic solvent or any combination of these effects. As used herein, the Volmer reaction comprises the adsorption of hydrogen by the metal catalyst; whereas, the Tafel reaction comprises the release of hydrogen from the metal catalyst that has hydrogen combined with it. The balance between the Volmer and Tafel reactions is such that hydrogen is made available in the process and its reductive capacity is utilized to effect the deposition of the coated metal on the substrate.

In the foregoing and following description of the invention, the various promoters have been defined generically and subgenerically. Thus, the promoters employed in the various cleaner/conditioner compositions have been defined subgenerically as a chelating agent, a thiourea compound and a surfactant. In the coating bath composition the promoter is defined subgenerically as an adjuvant selected from the group of polyhydroxy cyclic compounds, acetylenic alcohols and acetylenic compounds. The promoter may also be a water soluble polymer as defined herein.

When the metal catalyst is employed in an aqueous system, a stabilizer is used with the metal catalyst to minimize its sensitivity to water i.e., water in an amount that minimizes the function of or destroys the metal catalyst. A metal salt such as aluminum chloride and its equivalents are employed in this regard.

The present invention provides a novel method for the selective electrometallization of a non-metallic substrate without coating the substrate with an electroless metal coating. In one embodiment the invention relates to eliminating electroless plating of circuit boards and to effect through hole plating and/or directly form circuits thereon by an electrolytically deposited metal coating. The invention is carried out by applying a cleaner/conditioner to a non- metallic substrate such as a circuit board and imaging the substrate with an aqueous or solvent/aqueous developed photoresist. The term "imaging," as used herein, is intended to describe the process of applying the photoresist to the substrate, followed by exposing and developing the photoresist. Preferred photoresists comprise dry film resists that are developed by a water soluble developer, especially alkaline developers. After the film is imaged it is neutralized the preferred photoresist being neuralized with an acid. The cleaner/conditioner comprises:
 (a) a chelating agent (promoter);
 (b) a fluoride salt;
 (c) a thiourea compound (promoter)
 (d) a surfactant (promoter) selected from a member of the group consisting of nonionic, cationic, anionic, and amphoteric surface active agents;
 (e) an acid;
to obtain a cleaned and conditioned substrate or board.

A catalyst is then applied to said cleaned and conditioned substrate or board comprising:
 (a) a metal that can combine with hydrogen
 (b) an acid;
 (c) a salt of $Sn^{+2}$;
 (d) a member selected from the group consisting of an alkali metal stannate and a salt of $Sn^{4+}$;
 (e) a stabilizer such as a metal salt that can be hydrolyzed to yield a metal hydroxide precipitate having a pK lower than $$SnOHAn_1$$

where $An_1$ is a monovalent anion;
to obtain a catalyzed substrate or board.

The catalyzed substrate or board is then electrolytically coated with a composition comprising:

(a) a metal salt;
(b) an acid;
(c) an adjuvant (promoter) selected from a member of the group consisting of
  (i) polyhydroxy cyclic compounds especially those in which at least two hydroxyl groups are separated by one carbon atom;
  (ii) acetylenic alcohols and their derivatives and
  (iii) acetylenic cmmpounds
(d) a halogen ion.

Subsequent to or in some embodiments, prior to or both prior to and subsequent to applying the cleaner conditioner to said board, a photoresist is applied to the board, exposed and developed to form a circuit pattern on the board followed by the foregoing steps of applying the catalyst and electrolytically coating the board.

The photoresist film comprises any film that is developed by a developer that combines with the film and can subsequently be neutralized on the film. In one embodiment the photoresist film comprises a film that may be developed by a water soluble developer (aqueous system) or a combination of aqueous and non-aqueous developing steps. Riston (trademark) films that are known in the art may be used in this respect, especially those Riston (trademark) films that are developed by an aqueous alkaline system such as an aqueous sodium carbonate solution. The film is subsequently neutralized with an acid such as any of the acids disclosed herein. If photoresist films are available that are developed by an acidic developer, then neutralization of the film can be effected by any alkali, alkaline earth, ammonia, or organic neutralizing agent such as organic hydroxy compounds organic amines and the art known equivalents thereof. Various photoresist films that may be employed are known in the art and described in *Printed Circuits Hand Book*, Second Edition edited by C. F. Coombs, Jr., p. 6-9, paragraph 12 (and cited references) all of which is incorporated herein by reference.

The neutralization of the film after developing prevents or minimimizes plating out of the metal coating on the photoresist film and allows for selective plating. By employing a selective plating process, as described herein, the metal coating will be applied to the substrate and not some combination of the substrate and the photoresist film. Where the latter occurs, and the photoresist film is then removed, some of the meta film on the substrate will also tend to be removed. If the photoresist film is not removed, plating of the film could cause short circuits in those substrates comprising printed circuit boards.

In order to prevent plating of metal on the photoresist film, the board may also be polarized during the electrolytic coating process, especially where the photoresist film comprises an aqueous alkali soluble photoresist film.

The board may then be coated according to the invention to increase the thickness of the metal layer and/or for plating through holes in the board, followed by the application of an etch resist such as an immersion coating to the metal areas exposed through the photoresist. The metal surface that does not have the immersion coating applied to it is stripped or etched thereby leaving a circuit pattern on the board. The immersion coating may comprise a tin immersion coating. Prior to the application of the etch resist, the coated metal exposed through the photoresist may be electroplated to form one or more additional layers of metal that are the same or different from the coated metal, these additional layers also comprising metal alloys in some instances. In one embodiment, the coated metal may be copper or nickel. When nickel is applied, it may be subsequently coated with copper from an electrolytic bath followed by the application of an immersion tin etch resist coating, after which the photoresist is stripped and the coated metal (nickel) removed by etching.

The process therefore is especially effective for plating such boards and to directly effect through hole plating of the boards and/or form circuits thereon by an electrolytically deposited metal coating without an electroless metal coating.

The components of said cleaner/conditioner composition may be present in the following amounts on a molar basis:

| (1-a) | (a) | from about 2 to about 500 parts of a chelating agent; |
| --- | --- | --- |
| | (b) | from 0 to about 200 and especially about 0.3 to about 200 parts of a fluoride salt; |
| | (c) | from about 1.5 to about 90 parts of a thiourea compound; |
| | (d) | from 0 to about 0.8 and especially about 0.03 to about 0.8 parts of said surfactant; |
| | (e) | from 0 to about 0.3 part of a poly(oxyalkylene) condensate of an alkyl phenol; |
| | (f) | from about 10 to about 180 parts of an acid. | where at least one of (d) or (e) is present.

In one aspect of the invention a cleaner/composition is provided comprising:

| (1-b) | tartaric acid | 5-1000 g/l |
| --- | --- | --- |
| | citric acid | 5-1000 g/l |
| | ammonium bifluoride | 0.2-120 g/l |
| | thiourea | 1.2-90 g/l |
| | conditioner: | |
| | 1-propanaminium N—(2-hydroxyethyl)-N,N—dimethyl-3-[(1-oxooctadecyl)amino]-phosphate (Catanac SP Trademark 67.5% by weight in isopropyl alcohol) | 0.1-2 ml/l |
| | Triton X-100 (trademark) wetting agent | 0.1-2 ml/l |
| | H$_2$SO$_4$ (98%) | 5.0-300 ml/l |

The cleaner/conditioner may be prepared comprising the following:

| (1-c) | tartaric acid | 20 g/l |
| --- | --- | --- |
| | citric acid | 40 g/l |
| | ammonium bifluoride | 2 g/l |
| | thiourea | 15 g/l |
| | conditioner: | |
| | 1-propanaminium N—(2-hydroxyethyl)-N,N—dimethyl-3-[(1-oxooctadecyl)amino]-phosphate (67.5% by wt. in isopropyl alcohol) | 0.5 ml/l |
| | Triton X-100 | 1.25 ml/l |
| | H$_2$SO$_4$ (98%) | 100 ml/l |
| | water | balance |

In the foregoing formulations the Catanac SP and the Triton X-100 (a non-ionic polyoxyethylene octyl phenol condensate surfactant) comprises the surfactants and the citric acid and tartaric acid comprise the chelating agent.

The various equivalents as set forth herein for the foregoing components of the cleaner/conditioner and as known in the art may be substituted for such components on an equimolar basis.

The chelating agent (promoter) of the cleaner/conditioner composition may comprise any of the various classes of chelating agents and specific compounds disclosed in Kirk-Othmer, *Encyclopedia of Chemical Technology*, Third Edition, Volume 5, pages 339–368, incorporated herein by reference. Chelating agents that are preferred comprise the aminocarboxylic acids and the hydroxycarboxylic acids. Some specific aminocarboxylic acids that may be employed in this respect comprise ethylenediaminetetraacetic acid, hydroxyethylethylenediamine-triacetic acid, nitrilotriacetic acid, hydroxyethylethylene-diaminetriacetic acid, nitrilotriacetic acid, N-dihydroxy-ethylglycine, and ethylenebis(hydroxyphenylglcine). Tetra (lower alkyl) ammonium hydroxy compounds may also be employed where the lower alkyl has from about 2 to about 6 carbon atoms such as tetrabutyl ammonium hydroxide. Hydroxycarboxylic acids that may be employed comprise tartaric acid, citric acid, gluconic acid and 5-sulfosalicylic acid. Citric acid and its equivalents are especially preferred chelating agents. The amino carboxylic acids used as chelating agents include lysine, alanine, valine, leucine, isoleucine, proline, phenylalanine, tryptophan, methionine, glycine, serine, threonine, cystenine, tyrosine, asparagine, glutamine, aspartic acid, glutamic acid, arginine, histidine and the like such as the so called rare amino acids e.g. gamma-amino butyric acid, gamma-methyleneglutamic acid, 5-hydroxylysine and the like. Mixtures of chelating agents may also be used e.g. two or three or four component mixtures.

Any fluoride salt may be employed in the cleaner/conditioner in lieu of the ammonium bifluoride such as aluminum trifluoride, sodium fluoride, sodium bifluoride, potassium bifluoride, ammonium fluoride, fluorboric acid, and the like provided that the fluoride is liquid or solid at substantially room temperatures e.g. from about 10° C. to about 20° C. The alkali metal fluorides such as those based on the Group IA or IIA metals of the Periodic Table of Elements and ammonium may be used in this respect.

The thiourea compound may be represented by the

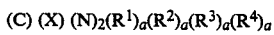

where
$R^1 =$ (1) H
(2) alkyl or alkenyl having up to about 6 carbon atoms
(3) aryl, aralkyl, or alkaryl having up to about 12 carbon atoms
(4) cycloalkyl, cycloalkylalkyl, or alkylcycloalkyl having up to about 12 carbon atoms
(5) $R^5$ (CO) where $R^5$ may be the same as radicals (2) through (4) as defined above for $R^1$
(6) $CH_2OH$
(7) (C) (X) (N)$_2$ $(R^1)_a(R^2)_a$(CO)$_2$
(8) (C) (X) (N)$_2$ $R^1$ $R^2$ $R^3$
(9) (C) (X) (N) $R^1$ $R^2$
(10) (C) (X) (N)$_2$ $R^1$ $R^2$ (CO)

$R^2$, $R^3$ and $R^4$ may be the same as radicals (1) through (6) as defined above for $R^1$.
a = 1 or 0

For the thiourea compounds including their analogs employed according to the present invention X=S, Se or Te; X preferably is S.

Mineral and organic acid salts of the thiourea compounds may also be used.

The thiourea compound of the presett invention comprises either thiourea or the various art known derivatives, homologs, or analogs thereof. Compounds that may be employed in this respect comprise 2,4-dithiobiuret; 2,4,6-trithiotriuret; alkoxy ethers of isothiourea; thiocyanuric acid (trimer of thiourea); thioammelide (trimer of thiourea); monoalkyl or dialkyl thiourea, where the alkyl group comprises a lower alkyl group, having up to about four carbon atoms such as diethyl thiourea or monoethyl thiorrea; saturated or unsaturated cyclic hydrocarbons mono- or disubstituted thioureas such as naphthyl thiourea, diphenyl thiourea, cyclohexyl thiourea and the like, where the cyclic hydrocarbons has up to about ten carbon atoms; the disulfide of thiourea; thio-imidol (the reaction product of thiourea and sodium hydroxide); thiocarbamic acid esters (the reaction products of thiourea and an alcohol comprising ROH where R is a saturated or unsaturated aliphatic or cyclic group having up to about ten carbon atoms) the oligomers of thiourea and formaldehyde, e.g., monomethylol, dimethylol, and trimethylol thioureas; S-alkyl pseudo thioureas (manufactured by the reaction of thiourea with an iodo lower alkane such as iodo methane where the lower alkyl group contains up to about five carbon atoms); thiocarbonic acid esters of thiourea and $R^5OH$, ($R^5$ as defined above) especially where $R^5$ is lower alkyl; thioureadioxide (aka formamidinesulfinic acid [1758-73-2, C.A. Reg. No.]); the reaction product of a saturated or unsaturated aliphatic or cyclic organic acid having up to about 12 carbon atoms and especially the lower aliphatic monocarboxylic acid reaction products with thiourea e.g. acylthioureas, and the mineral acid salts of thiourea e.g. thiourea mono- or di-sulfate.

Other thiourea compounds that may be employed comprise:
thiourea nitrate;
thiourea oxalate;
thiourea phosphate;
thiourea sulfate;
1-acetylthiourea;
1-acetyl-3-methylthiourea;
1-acetyl-2-thiourea;
S-acetyl-2-thiourea hydrochloride;
1-allylthiourea;
1-allyl-3-phenylthiourea;
1-allyl-2-thiourea;
1-(4-aminobenzenesulfonyl)thiourea;
1-(4-aminobenzenesulfonyl)-2-thiourea;
1-benzoyl-2-thiourea;
1-benzyl-2-thiourea;
1,3-bis(2-ethoxyphenyl)thiourea;
1-3-bis-(hydroxymethyl)thiourea;
1,3-bis(1-hydroxy-2,2,2-trichloroethyl)thiourea;
1(2-bromo-2-ethylbutanoyl)thiourea;
1(2-bromophenyl)thiourea;
1-butylthiourea;
1-butyl-3-phenyl-2-thiourea;
1(2-chlorophenyl)thiourea;
3(4-chlorophenyl)-1,1-dimethylthiourea;
1(2-chlorophenyl)-2-thiourea;
1(4-chlorophenyl)-2-thiourea;
1,3-diacetylthiourea;
1,3-diethyl-1,3-diphenylthiourea;
1,3-diethyl-1,3-diphenyl-2-thiourea;
1,3-diethyl-2-thiourea;
1,1-dimethylthiourea;
1,3-dimethyl-2-thiourea;
1,1-di(2-naphthyl)thiourea;
1,3-di(1-naphthyl)-2-thiourea;

1,3-di(2-naphthyl)-2-thiourea;
1,3-diphenylthiourea;
1,3-diphenyl-1-methylthiourea;
1,3-diphenyl-S-methyl-2-thiourea;
1,1-diphenyl-2-thiourea;
1,3-diphenyl-2-thiourea;
1,1-dipropyl-2-thiourea;
1,3-dipropyl-2-thiourea;
1,3-diisopropyl-2-thiourea;
1,3-di(2-tolyl)-2-thiourea;
1,3-di(4-tolyl)-2-thiourea;
1(3-ethoxyphenyl)thiourea;
1-ethylthiourea;
1-ethyl-1-phenylthiourea;
1-ethyl-3-phenyl-2-thiourea;
1-ethyl-2-selenourea;
1-ethyl-2-tellurourea;
1-ethylidene-2-thiourea;
1-hydroxythiourea;
1(hydroxymethyl)thiourea;
1(2-iodo-3-methylbutanoyl)thiourea;
isobutylthiourea;
1(2-isopropyl-4-pentenoyl)thiourea;
1(4-methoxy-phenyl)thiourea;
1(2-methyl-2-butyl)thiourea;
1-methyl-3(1-naphthyl)-2-thiourea;
1-methyl-1-nitrosourea;
1-methyl-3-phenyl-2-thiourea;
S-methyl-2-thiourea;
S- methylisothiouronium iodide;
S- methylisothouronium nitrate;
S- methylisothiouronium sulfate;
1-methyl-2-thiourea;
1(2-naphthyl)urea;
1(1-naphthyl)-3-phenyl-2-thiourea;
1(1-naphthyl)-2-thiourea;
1(2-naphthyl)-2-thiourea;
1-nitrothiourea;
1-oxalylthiourea;
1(2-phenoxy-ethyl)thiourea;
1-phenylthiourea;
1(phenyl-acetyl)thiourea;
1-phenyl-2-thiourea;
S-phenyl-2-thiourea;
2-selenourea;
2-tellurourea;
1(sulfonamylphenyl)thiourea;
1,1,3,3-tetramethyl-2-thiourea;
1,1,3,3-tetraphenyl-2-thiourea;
2-thio-1(2-tolyl)urea;
2-thio-1(3-tolyl)urea;
2-thio-1(4-tolyl)urea;
2-thio-1,1,3-trimethylurea;
2-thio-1,1,3-triphenylurea;
1(3-tolyl)thiourea;
1,1,3-trimethylthiourea;

Some thiourea compounds in addition to thiourea that may be employed according to the invention comprise:
phenylthiourea;
naphthylthiourea;
thiourea disulfide;
oligomers of thiourea and formaldehyde;
N-allylthiourea;
N-mono-p-tolylthiourea (and the equivalents thereof disclosed in U.S. Pat. No. 4,502,927, incorporated herein by reference); N-alkylthioureas such as methylthiourea (and the equivalents thereof disclosed in West German Pat. 3,110,478, incorporated herein by reference);
monophenylthiourea;
metaphenylenedithiourea;
N,N'-ethylenethiourea;
N,N'-dibutyneylthiourea;
N,N'-dibutenylthiourea;
trifluoro acetylthiourea;
isothiourea-S-propionic acid;
amino substituted thioureas such as thio semicarbazide and 1-phenylthiosemicarbazide; 1-aryl-thioureas where the aryl group is phenyl, benzylnaphthyl.

The surfactant (promoter) employed in the cleaner/conditioner composition, as noted above, comprises a conditioner selected from the group consisting of non-ionic, cationic, anionic and amphoteric surface active agents, especially those based on fatty acids. For the purpose of the present invention fatty acids comprise those substantially aliphatic acids having from about 10 to about carbon atoms.

More particularly, the surfactants (promoter) employed in the cleaner/conditioner composition comprises:
(a) quaternary ammonium compounds including;
   (i) cationic quaternary ammonium salts based on fatty amines,
   (ii) amphoteric quaternary ammonium salts based on fatty amines, and
(b) non-ionic surfactants of;
   (i) polyoxyethylene esters of fatty acids,
   (ii) polyoxyethylene esters of sorbitan fatty acid esters, and
   (iii) monoalkanolamides of fatty acids;

The cationic quaternary ammonium salts based on fatty amines that may be employed in this respect comprise:
(a) 1-propanaminium, N-(2-hydroxyethyl)N-N-dimethyl-3-[(1-oxooctadecyl) amino]-,salts;
(b) 1-propanaminium, N,N,N-trimethyl-3-[(1-oxododecyl)amnno]-alkyl ester salts;
(c) 1-propanaminium, (3-dodecyloxy)-2-hydroxy-N,N-bis(2-hydroxyethyl)-N-methyl-,alkyl ester salts.

The foregoing compounds may be prepared either as the phosphate salts, nitrate salts, methylsulfate salts and the like and are further identified as C.A. Reg. Nos. 3758-54-1; 2764-13-8; 1-595-49-0 and 18602-17-0. Although for the purpose of this invention, these compounds are defined as salts, this definition is intended to be broad enough to include the inorganic esters such as the lower alkyl esters e.g. methyl sulfate as well as the organic salts e.g. phosphates, nitrates, sulfates and the like.

Aliphatic amine ethoxylates of the formula:

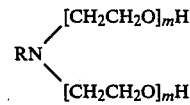

may also be employed as cationic quaternary ammonium salts based on fatty amines, as one of the groups of conditioners employed in the cleaner/conditioner composition of the present invention, wherein the aliphatic group R is derived from coco, soybean, tallow, stearyl or oleyl fatty acids. The value of m+n is anywhere from about 2 to about 15.

Additionally, alkylbenzyldimethylammoniumchlorides may be employed where the alkyl group is derived from a fatty acid and especially comprises a behenyl group. Some specific surfactants (promoters) that may be used in lieu of the cationic surfactant include the non-ionic surfactants such as the monoester of stearic acid and polyethylene glycol having a molecular weight of 400; the monoester of oleic acid and polyethylene glycol having a molecular weightoof about 400; the diester of oleic acid and polyethylene glycol having a molecular weight of about 400; the diester of oleic acid and polyethylene glycol having a molecular weight of about 600; the monoester of lauric acid and polyethylene glycol having a molecular weight of about 400; the monoester of lauric acid and polyethylene glycol having a molecular weight of about 600; the monoester of stearic acid and polyethylene glycol having a molecular weight of about 1750; the polyoxyethylene derivative of sorbitan fatty acid monoesters where the fatty acid is either lauric acid, oleic acid or stearic acid and there are about 20 ethylene oxide groups in the esterified poloxyethylene; oleic acid diethanolamide; oleic acid monoisopropanolamide ethyoxylated castor oil in which there are 200 ethylene oxide groups in the esterified polyoxyethylene.

Additionally, amphoteric surfactants based on fatty acids may also be used in lieu of the cationic quaternary ammonium salt such as the alkyl pyridinium halides or the amide propyl betaines, e.g. laurylpyridimium chloride or amidopropylbetaines of the formula:

$$RCONHCH_2CH_2CH_2N(+)(CH_3)_2CH_2(-)$$

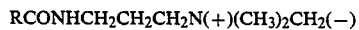

where RCO can be either myristoyl or cocoyl.

The non-ionic surfactant (promoter) of the cleaner/conditioner composition may comprise any surfactant that is compatable with the conditioner by which it is meant any surfactan that will not form a precipitate or adversely react with the conditioner as described herein. The surfactants generally defined as alkyl, e.g. octyl phenol poly(ethyeene oxide) condensates have been found to be suitable in this regard. Nonyl phenol poly(ethylene oxide) condensates may also be employed in this respect such as Igepal CO 430 (trademark GAF). These compounds and their art-known homologs comprise the poly(oxyalkylene) condensates of alkyl phenols used according to the invention.

The foregoing and other surfactants, (promoters) falling within the above definitions as described in Kirk-Othmer, *Encyclopedia of Chemical Technology*, Third Edition, Vol. 22, pp. 332–432 may be employed according to the present invention and are incorporated herein by reference.

The acids that are employed according to the invention may be organic acids or inorganic acids (mineral acids) based on sulfur, phosphorous, nitrogen or the halogens, the sulfur based mineral acids being e.g. sulfuric acid or sulfamic acid or methyl sulfonic acid. Solid acids may be used in this respect such as an alkali metal bisulfate, e.g., sodium bisulfate and the art known equivalents thereof. Fluoroboric acid may be used as one of the halogen acids in addition to acids based on hydrogen chloride, hydrogen fluoride, hydrogen bromide and hydrogen iodide. Some of the organic acids that may be employed according to the invention comprise monocarboxylic or dicarboxylic acids having up to about six carbon atoms such as formic acid, acetic acid, malic acid, maleic acid, and the like.

The cleaner/conditioner bath is employed according to the process of the present invention to clean the non-metallic substrate such as the circuit board by any known method of application such as dipping, spraying, roller application or misting and is maintaieed at a temperature from about 10° to about 90° C. and especially from about 20° C. to about 80° C. The non-metallic substrate is contacted with the cleaner/conditioner for a period of time sufficient for the cleaner/conditioner to function, this generally being from about 1 to about 20 minutes and especially from about 3 to about 5 minutes when the substrate is treated by dipping into the cleaner/conditioner compositon.

Any one of the foregoing poomoters may be used in the cleaner/conditioner composition or any combination of promoters i.e. any one of the chelating agents, thiourea compounds or surfactants may be employed alone as a cleaner/conditioner or various combinations thereof may be employed. By way of example, the Catananc (trademark) SP may be employed alone or the Triton X may be employed alone; however, when they are employed together, it is preferred that they be used with thiourea as well. The quantities of the various components of the cleaner/conditioner may be adjusted experimentally to optimize them for any particular metal catalyst or metal coating composition bath that the cleaner/conditioner is subsequently used with and is well within the skill of the art. Additionally, thiourea, Triton X and a mixture of both an organic acid such as the citric acid and sulphuric acid may be employed alone as the cleaner/conditioner. Citric acid either in a water solution or a mineral acid solution has also been found to be effective in this respect.

The substrate after treatment with the cleaner/conditioner is rinsed in distilled or deionized water after which it is treated with a catalyst for applying an electrolytic coating to the substrate.

Although the cleaner/conditioner composition comprises a chelating agent, fluoride salt, thiourea compound or mixtures thereof, a conditioner, surfactant and acid, the cleaner/conditioner may be applied to the non-metallic substrate in any sequence of steps such as by first applying the chelating agent and fluoride salt followed by the thiourea compound and conditioner or the chelating agent and the thiourea compound followed in sequence by an application of a mixture of the fluoride salt and surfactant agent and so forth. It is within the purview of the present invention therefore to employ the components of the cleaner/conditioner composition either individually or in any combination for a single or multiple step application of all of the components of the cleaner/conditioner composition or one or combinations of components of the cleaner/composition.

The substrate that has been treated with the cleaner/conditioner and rinsed is then, treated with a catalyst for applying an electrolytic coating to the substrate.

The components of the catalyst are present in the following amounts on a molar basis:

| (2-a) | (a) | from about 0.1 to about 2 parts of a metal salt the metal of which can combine with hydrogen; |
|---|---|---|
| | (b) | from about 3 to about 6 parts of an acid; |
| | (c) | from about 4 to about 85 parts of a salt of $Sn^{2+}$; |
| | (d) | from about 0.5 to about 10 parts of an alkali metal stannate or salt of $Sn^{4+}$; |

| (e) | from about 100 to about 1000 parts of a stabilizer. |
|---|---|

In one aspect of the invention a catalyst composition is provided comprising:

| (2-b) | Solution I | palladium chloride | 0.19–3.8 g/l |
|---|---|---|---|
| | | HCl (11.7%) | 0.25–5 ml/l |
| | | sodium stannate | |
| | | ($Na_2SnO_3.3H_2O$) | 1.4–28 g/l |
| | | stannous chloride | 8.2–164 g/l |
| | Solution II | $AlCl_3.6H_2O/H_2O$ | 50–1000 g/l |
| | | Solution I | 25–500 ml |
| | | Solution II | 75–1500 ml |

A catalyst composition may be prepared comprising the following:

| (2-c) | Solution I | palladium chloride | 1.9 g/l |
|---|---|---|---|
| | | HCl (11.7%) | 2.5 ml/l |
| | | stannous chloride | 82 g/l |
| | | sodium stannate | |
| | | ($Na_2SnO_3.3H_2O$) | 14 g/l |
| | | water | balance |
| | Solution II | $AlCl_3.6H_2O$ | 500 g/l |
| | | Solution I | 250 ml |
| | | Solution II | 750 ml |

Aluminum chloride is used as a stabilizer in formulas (2-b) and (2-c).

The catalyst composition, according to one embodiment of the invention may be prepared as follows:

SOLUTION I

Dissolve 1.9 g of $PdCl_2$ in 25ml aqueous 11.7% HCl and mix for 15–25 minutes. The hydrochloric acid acts as a solvent for the palladium chloride although other solvents may be used such as water or an organic solvent. The solution of palladium chloride then has 75 ml of an aluminum chloride solution comprising 500 g per liter of $AlCl_3.6H_2O$ added to it followed by mixing for 30 minutes to complete the dissolution of the palladium chloride. Stannous chloride (3.7 g) is then added to the solution followed by mixing for 10 minutes.

SOLUTION II

Stannous chloride (78 g) is added to 500 ml of an aluminum chloride solution as prepared for SOLUTION I followed by mixing for 20–30 minutes. A turbid solution is obtained. A sodium stannate solution is prepared separately by mixing 14 grams $Na_2SnO_3.3H_2O$ in 100 ml of the aluminum chloride solution as prepared in SOLUTION I. This mixture of sodium stannate in the aluminum chloride solution is then added to the stannous chloride-aluminum chloride solution slowly and the two are then mixed for 10 minutes. A solution is then obtained with some precipitate in it.

SOLUTION II (including the precipitate) is then added to SOLUTION I within 1 minute after which the combination of SOLUTION I and SOLUTION II are heated from about 60° to about 70° C. for 3 hours with constant agitation. This mixture is then let stand and cooled to room temperature while the stirring is continued and a highly concentrated catalyst is obtained. The concentrate catalyst is used in practice by combining 1 ml of the concentrated catalyst with 3 ml of the aluminum chloride solution as prepared for SOLUTION I.

The foregoing preparation of the catalyst may be speeded up by modifying the preparation of SOLUTION I so that the palladium chloride dissolved in hydrochloric acid is mixed with the aluminum chloride solution for a period of 5 minutes after being heated to 90° C. after which the 3.7 g of the stannous chloride is added to the mixture obtained. SOLUTION II is then added immediately within a period of 1 minute, then heated for 15 minutes to 90°–100° C.

In the foregoing catalyst composition the metal catalyst that can combine with hydrogen preferably is based on the Group VIII metals of the Periodic Table of the Elements and especially the Group VIII noble metals of the Periodic Table of the Elements e.g. rhodium, palladium, osmium, iridium and platinum. Palladium is especially preferred in this respect. It has been found that the metal catalyst can be prepared from halogen salts of the catalyst and that halogen acids may be employed in the catalyst composition of the present invention. Palladium chloride has been found to be especially suitable as the metal salt from which the metal catalyst is prepared. The foregoing metal catalysts may also be employed in amounts as low as 10 ppm and as high as 20 g/l.

The various acids employed in the catalyst composition again comprise the art known mineral acids and organic acids such as those mineral acids and organic acids set forth herein and especially hydrochloric acid. The hydrochloric acid is generally employed in an amount sufficient to dissolve the palladium chloride.

The salt of $Sn^{2+}$ is again based on the art known mineral acids and organic acids and especially comprises stannous chloride whereas the alkali metal stannate or the salt of $Sn^{4+}$ is selected to equilibrate in the catalyst with the salt of $Sn^{2+}$. The alkali metal stannates are based on the Group IA metals of the Periodic Table of the Elements or the Group IIA metals of the Periodic Table of the Elements such as lithium, sodium, potassium, calcium, strontium or barium, ammonium cations, for the purposes of the present invention, being considered a cation that falls into this category and which may be employed. It has been found that by employing the alkali metal stannate or a salt of $Sn^{4+}$ that better coverage is obtained of the catalyst on the nonmetallic substrate providing a more efficient coverage rate and less chance of voids.

The stabilizer metal salt in one embodiment is a metal salt that can be hydrolyzed to yield a metal hydroxide precipitate having a pK lower than $SnOHAn_1$ and preferably is one where $\overline{An_1}$ is a monovalent anion based on the art known mineral acids and organic acids, especially those described herein and preferably a halide such as a chloride ion.

The stabilizers that may be employed in this respect comprise the Group IIIA metal salts of the Periodic Table of the Elements and especially the water soluble, stable halide salts and more particularly, the chlorides or bromides. Those Group IIIA salts that exist in the "dimer" form such as aluminum chlorohydrate have found to be especially useful. Other Group IIIA salts that may be employed in this respect, especially the dimer salts are described more fully by Cotton and Wilkinson *Advanced Inorganic Chemistry* 1972 pp. 264–265 which is incorporated herein by reference. The stable, water soluble salts and especially the halide salts of the Group IIIA metals are those that are preferred such as aluminum chloride.

Other stabilizers that may be employed in this respect comprise other Group IIIA metal salts or metal salts that will form complexes with the Group VIII metals especially the Group VIII noble metals and/or tin. Examples of such salts and complexes comprise by way of example, aluminum bromide; aluminum bromide hexahydrate; aluminum bromide pentadecylhydrate; aluminum chloride, aluminum chloride hexahydrate; aluminum iodide; aluminum iodide hexahydrate; cadmium chloride; cadmium chloroplatinate; cobalt II bromide; cobalt bromoplatinate; cobalt II chloride dihydrate; cobalt II chloride hexahydrate; cobalt chloride; cobalt chloroplatinate; cobalt II iodate; cobalt II iodate hexahydrate; cobalt II alpha iodide; cobalt chlorostannate; cobalt II iodide dihydrate; cobalt II iodide hexahydrate; cobalt iodoplatinate; cobalt II orthostannate; magnesium bromide; magnesium bromide hexahydrate; magnesium bromoplatinate; magnesium chloride; magnesium chloride hexahydrate; magnesium chloropalladate; magnesium chloroplatinate; magnesium chloro stannate; magnesium cyanide; magnesium cyanoplatinide; magnesium platinocyanide; manganese diiodide; manganese iodide tetrahydrate; manganese hexaiodoplatinate; nickel chloride; nickel chloride hexahydrate; nickel chloropalladate; nickel chloroplatinate; silver nitrite; silver nitriplatinite; thallium chloride; thallium trichloride; thallium trichloride monohydrate; thallium trichloride tetrahydrate; thallium chloroplatinate; zinc chloride; zinc chloroplatinate; and the like.

Other stabilizers that may be employed comprise titanium tetrachloride, and titanium oxychloride as well as zirconium oxychloride; zirconium chloride, hafnium oxychloride; hafnium chloride; gallium oxychloride and gallium chloride.

A Group VIII metal catalyst that may be employed may comprise the conventional palladium catalyst ordinarily utilized for the electroless copper steps described herein for the manufacture of printed circuit boards, the palladium catalyst in this respect comprising either the two component (stannous chloride sensitizer solution followed by a super sensitizer solution of di-valent palladium chloride) or the colloidal palladium catalyst containing stannic tin as a protective colloid around the palladium catalyst. These conventional catalysts may be employed alone or in combination with the promoters and/or stabilizers as noted herein.

An optional "brightener" may also be employed in the catalyst composition in an amount from about 10 ppm up to about 10 g/l such as those brighteners disclosed in the U.S. Pat. Nos. to Houman; 4,490,220: Willis; 4,347 Coll-Pallagous; 4,278,739: Combs; 4,272,335: Ostrow et al.; 3,798,138: Creutz; 3,770,598 and Kessler et al.; 3,725,220: all of which are incorporated herein by reference.

In applying the catalyst composition, the cleaned and conditioned substrate as obtained from the previously described process for employing the cleaner/conditioner is immersed in the catalyst for a period of time from about 0.5 to about 15 minutes and especially from about 3 to about 5 minutes, the catalyst being maintained at a temperature of from about 15° to about 80° C. and especially from about about 65° C. After the substrate is immersed in the catalyst composition, it is rinsed in distilled or de-ionized water and is thereby ready to be electroplated.

The catalyzed substrate or circuit board is then coated electrolytically in a metal plating composition or bath known in the art.

The components of the metal plating bath may be present in the following amounts on a molar basis:

| (3-a) (promoter) | (a) from about 2.5 to about 50 parts of a metal salt |
| | (b) from about 15 to about 40 parts of an acid |
| | (c) from about 0.4 to about 8 parts of an adjuvant e.g. hydroxy compound |
| | (d) from about 50 to about 100 ppm of a halide ion. |

The metal composition or bath may be a copper plating bath in one embodiment and comprises the following composition of matter:

| (3-b) | $CuSO_4 \cdot 5H_2O$ | 30–300 g/l |
| | $H_2SO_4$ (98%) | 10–200 ml/l |
| | pyrogallol (1) | 0.05–1 g/l |
| | chloride ion | 10.0–100 ppm |
| | water | balance |

The copper plating bath may be:

| (3-c) | $Cu_2SO_4 \cdot 5H_2O$ | 80 g/l |
| | $H_2SO_4$ (98%) | 100 ml/l |
| | pyrogallol (1) | 0.5 g/l |
| | chloride ion as NaCl or HCL | 50–100 ppm |
| | water | balance |

(1) Equimolar amounts of resorcinol, propargyl alcohol; 2,4-dihydroxy-6-methyl pyrimidine, hydroxy ethylcellulose or combinations thereof may be substituted for pyrogallol.

Metals besides copper may be plated and are known in the art. Examples of such metals are Au, Ag, Co, Ni, Pb, Pd, Pt and the like.

The anion of the metal salt in the plating composition or bath may be based on any of the acids described herein and the aciss employed in the plating bath may similarly be selected from the acids described herein. Mineral acids are especially suitable in both respects.

The adjuvant (promoter) may comprise a polyhydroxy compound including a cyclic polyhydroxy compound having a six carbon atom ring and from 2 to about 3 hydroxy groups on the ring and is optionally mixed with a cyclic hydroxy compound having a six carbon atom ring and one hydroxy group on said ring, the cyclic hydroxy compound being present in an amount from 0 to about 80 molar percent of said polyhydroxy compound on a molar basis.

The polyhydroxy cyclic compound may also comprise a saturated, partially unsaturated or unsaturated ring having from 5 to about 14 carbon atoms and may be either a monocyclic or bicyclic compound which optionally contains substituents in addition to the hydroxy groups. The polyhydroyy cyclic compound, may also comprise a heterocyclic cyclic compound containing ring nitrogen, sulfur or oxygen atoms or combinations thereof and also may be saturated, partially unsaturated or unsaturated; substituted with other than hydroxy groups and may contain from 5 to about 14 ring carbon atoms and also may be either a monocylic or bicyclic compound.

The polyhydroxy cyclic compounds that may be employed in this respect generally have the formula:

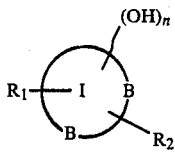

where
- "I" is either a five member or a six member ring which is saturated, partially unsaturated or unsaturated;
- B=C,N,S,O or various combinations thereof so that "I" may be benzene, cyclohexane, cyclopentane, cyclopentene, thiophene, furan, pyran, isothiazole, pyrrole, imidazole, pyrazole, pyridine, pyrazine, pyrimidene, pyridazine pyrrolidine, pyrroline, isoxazole, isothiazole, furazan, imidazoline, pyrazolidine, pyrazoline, piperidine, piperazine, indoline, isoindoline, morpholine and the like.
- n=2 to about 3
- $R_1$=hydrogen, lower alkyl such as an alkyl group having from 1 to about 6 carbon atoms whether straight chain or branched chain, $NH_2$, $CONH_2$, COOH, $SO_3H$, S—S—H; $R_2=R_1$ or hydrogen or when taken with "I" forms naphthalene, anthracene, phenanthrene, quinoline, isoquinoline, phthalizine, naphthyridine, quinoxaline, quinazoline, cinnoline, pteridine; phnnylbenzene, toluene; benzofuran and the like or a indolizine, isoindole, indole, indazole, purine, carbazole and the like.

The various compounds that may be used as a polyhydroxycyclic compound include, resorcinol, pyrogallol and phloroglucinol.

Polyhydroxy cyclic compounds having from 1 to about 2 nitrogen atoms are especially effective such as 2,4-dihydroxy-6-methylpyrimidine.

The various acetylenic alcohols (promoters) that may be employed in the copper plating bath comprise propargyl alcohol; butyne diol; hydroxyethyl propargyl ether; bis(hydroxyethoxy)butyne; 2-hydroxypropylbutynyl ether; hexyne diol; 2-methyl-3-butyn-2-ol;3-methyl-1-penten-3-ol;3,4-dimethyl-1-pentyn-3-ol;3-ethyl-1-pentyn-3-ol;3-isopropyl-4-methyl-1-pentyn-3-ol;3-methyl-1-hexyn- 3-ol,3-propyl-1-hexyn-3-ol; propargylysulphonic acid; 1-butyne-3-sulphonic acid. Acetylenic compounds (promoters) may comprise 1-pentyne-5-sulphonic acid; 4-diethylamino-2-butyne-1-ol; (N-methyl)-propargylamine, 1-di(N)ethyl amino-2-propyne; 4-diethylamino-1-butyne-1,6-bis(morpholino)-2-hexyne; 2-butyne-1,4-disulphonic acid;1-or2-butyne sulphonic acid; propargylsulphonic acid; 1-pentyne sulphonic acid, the various ammonium salts of the aforementioned acids; N-propargyl saccharin; 2-butyne di-sulpholanylether and the like and mixtures thereof.

The halide ion employed in the metal plating composition or bath may be a fluoride, chloride, bromide or iodide ion or mixtures thereof. Chloride ions have been found to be effective in this respect. The cation employed in combination with the halide ion generally comprises any cation or mixtures thereof based on Group IA metals or Group IIA metals of the Periodic Table of the Elements such as lithium, sodium, potassium, magnesium, calcium, strontium, and barium, ammonium cations also being suitable in this regard.

Water soluble polymers may also be employed as an adjuvant (promoter) in the metal plating composition or bath. The water soluble polymers that may be employed in this respect comprise synthetic or natural polymers that are generally solid or near solid at room temperature (about 20° C.) are soluble in water under the conditions the composition is used and are stable in an acid environment, i.e., a pH of about 1 to about 6.8. Stability in this regard is the resistance of the polymer to decompose and/or discolor under the conditions of use. Conditions of use include both the use in the composition and when the composition is applied to form a coating on a surface. An acrylic resin, Acrysol WS-24, (trademark), sold by Rohm and Haas is especially suitable in this respect and comprises a polymer of acrylic acid. Other water soluble acrylic polymers may be employed including the copolymers of acrylic acid and methacrylic acid and the mono lower alkyl esters thereof, e.g., methacryli acid - butyl acrylate co-polymers. Polymers of methacrylic acid and partial lower alkyl esters thereof or of acrylic acid may also be employed. The acrylic polymers that are employed typically have molecular weights from about 2000 to about $4\times 10^6$ and are commercial products well known in the art. All of the foregoing acrylic resins will be referred to herein as acrylic polymers.

Other water soluble polymers that may be employed in this regard comprise the poly(vinyl alcohols) or copolymers of poly(vinyl alcohol) and vinyl acetate; polyacrylamides, including both the nonionic, cationic and anionic types, the nonionic and cationic being especially preferred, some of which are sold under the trademark of "Seperan" (Dow Chemical Co.), e.g., Separan NP10, AP273, MGL, MG200, MG500, PEG, CP-7 and 87D; polyethylene oxide resins having a molecular weight of from about $10\times 10^5$ to about $5\times 10^6$ provided that the cloud point of the polymer in water does not adversely affect the coating properties of the composition which will vary with the components of the composition; poly(N-vinyl-2-pyrrolidinone) homopolymers and copolymers with vinyl acetate having a molecular weight from about 2500 to about $6.3\times 10^5$ and sold under the trademark "Kollidon" (homopolymer) and "Luviskol" (copolymer) by BASF, the homopolymer being preferred because of its increased water solubility; vinyl ether polymers such as the homopolymers of alkylvinyl ethers, vinyl ether-maleic anhydride copolymers, especially methylvinyl ether-maleic anhydride copolymers sold under the trademark "Gantrez" by GAF; styrene-maleic anhydride copolymers having a molecular weight of from about 1000 to about 50,000; ethylene maleic anhydride copolymers having a molecular weight of from about $8\times 10^3$ to about $1\times 10^5$; phenol formaldehyde resins such as resols (base catalyzed one-step) water soluble resins and their precursors such as dimethylol phenol and the like; amino resins an plastics such as condensation products of formaldehyde with urea, melamine, benzoguanamine, acetoguanamine, aniline, toluenesulfonamide, acrylamide and the like, the methylol condensation products of these amines being especially suitable because of their solubility in water; specific amine resins include urea formaldehyde, melamineformaldehyde, methylolurea, dimethylolurea, mono-, di-, and trimethylolmelamine, alkylated urea formaldehyde resins including alkylated methylol and dimethylolurea (where the alkyl group is a lower akkyl, i.e., from 1 to about 4 carbons), alkylated melamine formaldehyde resins as well as alkylated mono-, di- and trimethylol melamines where the alkyl group is the same as defined for the alkylated urea formaldehyde resins; ethyleneurea resins; propyleneurea resins; triazone resins; uron resins, i.e., mixtures of melamine resins, N,N'-bis(methoxymethyl)uron and methylated urea formaldehyde resin; glyoxal resins commonly referred to as resins of dimethyloldihydroxyethyleneurea; methylol carbamates; methylol derivatives of acrylamine, hydantoin and dicyandiamide; natural polymers such as the vegetable gums including agar, carragenan, corn starch, guar gam, gum araiic, gum karaya, gum tragacanth, locust bean gum; starches derived form potatoes, wheat and rice; tapioca; hydroxyalkyl starch; hydroxy methyl or ethll cellulose; hydroxy propyl cellulose; methyl cellulose; ethyl cellulose; sodium carboxymethyl cellulose; xanthan gum; pectin; casein (milk protein); animal gelatine and the like. All of the foregoing are standard items of commerce and are readily available. Hydroxy ethylcellulose is preferred especially in combination with glucose. Mixtures of these water soluble polymers may also be used.

When the water soluble polymer is employed in the metal plating bath formulas it will be added in an amount such that when the components of these formulas are made up into a solution, the final concentration of the water soluble polymer in the solution used will be about 0.01 g/1 up until a concentration such that a workable viscosity is not exceeded in the plating bath composition. Hydroxyethyl cellulose and hydroxy methylcellulose have been shown to be effective in this respect in some of the electroplating bath compositions of the present invention especially with glucose or the Catanac or Trtton X surfactants or combinations thereof.

The catalyzed substrate or board obtained from the previous steps of the process according to the present invention is then immersed in the metal plating bath and employed as a cathode in a standard manner. The bath is maintained at from about 18° to about 30° C. and a current is applied to the board at a current density of from about 0.1 to about 10 and especially from about 2 to about 6 amps/square decimeter for a period of time sufficient to get an electrolytic buildup of metal on the board.

Although the potential employed for the copper plating bath may be anywhere from about 0.4 to about 1.2 volts the potential that is employed for the process of the invention depends on the cell configuration, the concentration of the plating bath solution, the cathode and anode size, shape, and spacing as well as the agitation employed in the bath, whether mechanical or air agitation, the size and shape of the substrate and where the substrate comprises the through holes of a circuit board (whether a double sided single board or a multilayer board) the size of the hole, the promoters employed and the metal that is being plated. In the latter respect, it should be noted that although about 0.4 to about 1.2 volt potential employed for plating copper will effect through hole plating in most conventional copper plating baths, a potential of about 3.0 volts is required to obtain similar results with a gold plating bath. Further in this regard, when the process of the invention is employed to provide coatings on the surface of a printed circuit board, different potentials will also be required, all of which can be determined by a person having ordinary skill in the art. The current and current density is therefore adjusted along with the potential so as to obtain a substantially void free continuous metal layer.

Plating is effected where the substrate or board has an area that is either uncoated or partially clad or coated with a metal such as copper as is the case with boards used for the manufacture of printed circuits.

Where the board is unclad or uncoated with a metal film, the process of the present invention can be employed to apply a 10 micron copper coating from a conventional copper bath onto the surface of an epoxy laminate multilayer board array. A cleaner/conditioner is apllied to the board in a manner described herein and a dry photoresist film is applied prior to the copper coating, exposed, developed and neutralized. After coating, the copper surface is cleaned with a dilute acid solution and a surfactant. In another embodiment, a conventional metal plating bath may be used to subsequently apply a metal coating such as a copper layer over the first metal layer on the board even where the first metal layer is the same as the second metal layer. For example, a copper layer may be placed over a copper layer.

When two or more baths are employed in this regard, the potential is controlled (i.e. adjusted) in the first metal coating bath to optimize the metal coating on the non-meallic substrate, whereas the current is controlled or adjusted in the second or subsequent metal coating bath to optimize the thickness of the metal coating.

The coated metal (copper) applied according to the present invention is applied in a thickness sufficient to enable the subsequent metal layer to be applied over it. The metallic layers applied in this regard may be the same or different to produce alloys at the interface of the layers. Each of the subsequently applied layers of metals may also be alloys or some mixture of two or more metals.

The thickness of the coating or coatings is dependent on the length of time over which the coating process is carried out and will vary depending upon the particular application.

Unlike the composition and method described by Strickland et al. U.K. No. 1,222,969 the application of the cleaner/conditioner, catalyst and plating bath to the non-metallic substrate does not result in the formation of an electroless coating of one of the metals in the plating bath composition. Metal coatings cannot be obtained according to the present invention without the application of an electric potential to the bath.

The various circuit boards that may be coated in this respect are described herein; the composition of the process of the present invention being especially suitable for the application of an electrolytic coating to the surface of either an epoxy reinforced glass circuit board or a pheholic resin glass reinforced circuit board as well as the flexible boards such as those based on Kevlar, Nylon or Teflon (trademark). Other circuit boards as described herein may also be coated employing the composition and the process of the present invention.

The compositions of formulas (1-c),(2-c) and (3-c) are applied to an epoxy-glass reinforced circuit board having through holes drilled therein ad the through holes are electrolytically plated with copper when employing the process conditions for applying the various compositions as described herein.

By employing the compositions and the process of the present invention a circuit board that is either unclad or partially clad with metal such as copper or which is partially coated with copper (e.g. along the periphery of the board) may be directly converted into a printed circuit board by applying the aforementioned photoresist to the surface of the circuit board, projecting a circuit image onto the board and developing the image to leave uncoated areas on the board conforming to the circuit pattern. Either prior or subsequent to the application of the photoresist, through holes are drilled in the board. The board, with the developed photo resist in place may then be neutralized and coated directly with the compositions and according to the process of the present invention to form not only a circuit on the board but also to effect through hole plating simultaneously. The advantage of this process is the elimination of the electroless coating of copper onto the circuit board employing the compositions and lengthy processing steps of the prior art.

When employing the process of the present invention, the copper plates out directly onto the circuit pattern as well as in the through holes without plating on the photo resist wheretthe photo resist comprises a water soluble film. Where an aqueous alkali soluble resist is employed, there is some tendency for the copper to plate out on the film in addition to the thoough holes and the circuit areas. This plating out on the resist is eliminated by employing the precess of the invention (i.e. neutralizing the developed photoresist film) and optionally, using a polar technique for electrolytically depositing the copper either by reversing the cathode and anode periodically or by employing a pulsed current to the electroplating bath both of which are processes that are known in the art.

In another embodiment the compositions and process of the present invention are employed only for the PTH process where the circuits on the printed circuit are formed in an art known manner, using either a copper coated or a copper clad circuit board, and the circuit on the outer layer of a multi-layer board or other circuit board is formed according to the previously described methods that are known in the art such as by the use of a photoresist film. Plating of the photoresist film in this respect (i.e. when conducting the PTH process is also avoided by the aforementioned neutralizing processes and optional polarization processes.

It has been found that the metal plating of the through holes in accord with the present invention will also result in the deposition of a metal film that can be subsequently coated with tin or tin alloys as an etch resist in accord with methods that are known in the art or by employing an immersion tin coating specifically described in copending U.S. patent application Ser. No. 808,879, 12-13-85, which is incorporated herein by reference. This co-pending application describes the formulation and method of applying the tin-immersion coating subsequently described herein and which avoids the problems of the prior art tin immersion coatings.

In a further example, conventional low-build copper and hi-build copper coatings were applied to epoxy glass reinforced circuit boards using methods employed in the art and compared to a process (described herein as the SELECTIVE ABC process) employing the cleaner/conditioner, catalyst and copper electroplating compositions and methods of the present invention in combination with the tin immersion coating. The number of stess and coating times for each were compared as follows:

| | | TIME - MINUTES | | |
| --- | --- | --- | --- | --- |
| Sequence | Process | conventional low-build coating | conventional hi-build coating | SELECTIVE ABC |
| 1 | cleaner/cond | 3-5 | 3-5 | 3-5 |
| | rinse × 2 | 2 | 2 | 2 |
| 2 | microetch | 3-5 | 3-5 | (1) |
| | rinse × 2 | 2 | 2 | — |
| 3 | catalyst Pre-Dip | 1 | 1 | — |
| 4 | catalyst | 3-5 | 3-5 | 3-5 |
| | rinse × 2 | 2 | 2 | 2 |
| 5 | accel/post cat. | 6-10 | 6-10 | — |
| | rinse × 2 | 2 | 2 | — |
| 6 | electroless copper | 15-20 | 20-30 | — |
| | rinse × 2 | 2 | 2 | — |
| 7 | 10% sulpuric Dip | 1 | 1 | — |
| | rinse × 2 | 2 | 2 | — |
| 8 | Electrolytic Panel plate | 10-15 | — | 40-50 |
| | rinse × 2 | 2 | — | 2 |
| 9 | Dry film process | CONSTANT TIME | | |
| 10 | acid cleaner | 3-5 | 3-5 | — |
| | rinse × 2 | 2 | 2 | — |
| 11 | microetch | 1-2 | 0.5-1 | — |
| | rinse × 2 | 2 | 2 | — |
| 12 | 10% sulfuric Dip | 1 | 1 | — |
| 13 | electro. Cu Pat. plate | 30-40 | 40-50 | — |
| | rinse × 2 | 2 | 2 | — |
| 14 | 5% fluoroboric Acid Dip | 1 | 1 | — |
| 15 | Immersion tin coating | 3-5(2) | 3-5(2) | 3-5(2) |
| | rinse × 2 | 2 | 2 | 2 |
| | Total | 103-138 | 103.5-138 | 55-71 |
| | Average | 120.5 | 120.75 | 63 |
| | No. of Processes (incl. double counterflow rinses) | 24 | 23 | 8 |

(1) Aqueous sodium carbonate developed Riston (trademark) photoresist dry film process followed by neutralization with 40 g./L. citric acid/$H_2O$; employed in step 2 and not in step 9.
(2) immersion tin plating composition of Docket 5917

Thus, it can be seen that the present invention, in one embodiment, reduces the number of process steps of the prior art (23-24) to 8 steps and the time from about two hours to approximately one hour. It has been found that the novel cleaner/conditioner is not removed in the imaging step and still functions with the catalyst to obtain selective plating by the process of the invention. The present invention thereby provides a striking advantage not only in the amount of time saved compared to the prior art steps for depositing the copper coating but also accomplishes this without an electroless plating process. The electroless plating bath process is hard to control, the baths tends to decompose and are difficult to replenish. Accordingly, eliminating the electroless process is an exceptional advantage achieved according to the present invention. Additionally, the number of process steps is reduced to approximately ⅓ of those employed previously and the time cut in half. Not only is the amount of equipment for applying the coating reduced (by eliminating various processing lines) but also the number of trained operators which provides some savings in labor costs. Less floor area is used for the plating lines which further lowers capital expenditures required for building a coating line employing the novel process and compositions.

Although the invention has been described by references to some embodiments, it is not intended that the novel cleaner/conditioner; catalyst and electroplating bath compositions and the process of selectively coating nonmetallic substrates by eliminating the electroless plating step previously employed is to be limited thereby but that modifications thereof are intended to be included as falling within the spirit and scope of the foregoing disclosure and the following claims:

What is claimed is:

1. In a process for selectively depositing metals on a non-conductive substrate by employing the reductive capacity of hydrogen in the presence of a metal catalyst on the substrate, said metal catalyst being capable of combining with hydrogen that is generated electrolytically from a protic bath; said substrate being contacted with said metal catalyst to obtain a substrate that is combined with said catalyst; said substrate combined with said metal catalyst being contacted with a protic bath; the steps comprising:
    (a) imaging a photoresist on said substrate and neutralizing said photoresist after imaging and prior to contacting said substrate with said metal catalyst
    (b) electrolytically generating hydrogen from said protic bath in an amount sufficient to combine with said metal catalyst and thereby obtain a metal catalyst combined with said hydrogen on said substrate
    (c) contacting said metal catalyst combined with hydrogen on said substrate with a metal salt for a time sufficient to reduce said metal salt to a metal coating on said substrate.

2. The process of claim 1 where said metal salt is present in said protic bath.

3. A process for depositing metals on a nonconductive substrate by employing the reductive capacity of hydrogen in the presence of a metal catalyst on the substrate, said metal catalyst being capable of combining with hydrogen that is generated electrolytically from a protic bath comprising:
    (a) imaging a photoresist on said substrate and neutralizing said photoresist after imaging
    (b) contacting said substrate with said metal catalyst to obtain a metal substrate that is combined with said catalyst;
    (c) contacting said substrate combined with said metal catalyst with a protic bath,
    (d) electrolytically generating hydrogen from said protic bath in an amount sufficient to combine with said metal catalyst and thereby obtain a metal catalyst combined with said hydrogen on said substrate
    (e) contacting said metal catalyst combined with hydrogen on said substrate with a metal salt for a time sufficient to reduce said metal salt to a metal coating on said substrate.

4. The process of claim 1 where said metal salt is present in said bath.

5. The process of claims 3 or 4 where said metal catalyst is combined with a promoter.

6. The process of claims 3 or 4 where said metal catatyst is combined with a promoter
    (a) by applying said promoter to said substrate before contacting said substrate with said metal catalyst or
    (b) by adding said promoter to said metal catalyst or
    (c) by adding said promoter to said protic bath or any combination of steps (a), (b) or (c).

7. The process of claim 5 where said promoter is selected from the group consisting of
    (a) organic hydroxy compounds
    (b) surfactants
    (c) thiourea compounds
    (d) amino acids
    (e) polycarboxylic acids and
    (f) water soluble polymers
or mixtures therof.

8. The process of claim 3 where said metal catalyst is based on a metal of Group VIII of the Periodic Table of the Elements that combines with hydrogen.

9. The process of claim 7 where said metal catalyst is appiied to said substrate from an aqueous system and contains a protective colloid.

10. The process of claim 9 where said protective colloid is a tin colloid.

11. The process of claim 3 where said metal catalyst is employed in an aqueous system and is further combined with a stabilizer that minimizes said metal catalyst's sensitivity to water, said stabilizer comprising a metal salt.

12. The process of claim 11 where said stabilizer is selected from a member of the group consisting of the salts of magnesium, titanium, zirconium, hafnium, manganese, cobalt, nickel, silver, zinc, cadmium, aluminum, gallium, indium and thallium and mixtures thereof.

13. The process of claim 9 where said stabilizer is selected from the group consisting of the salts of aluminum, titanium, zirconium and hafnium.

14. The process of claims 12 or 13, where said stabilizer comprises stable water soluble halide salts.

15. The process of claim 12 where said stabilizer forms complexes with the Group VIII metals or tin or both.

16. The process of claim 14 where said stabilizer comprises an aluminum halide.

17. The process of claim 3 where said photoresist is developed by means bf an alkaline developer and said neutralizing is effected by means of an acid.

18. The process of claim 17 where said developer is an aqueous alkaline developer.

19. The process of claim 3 where said substrate, prior to or subsequent to said imaging is contacted with a cleaner/conditioner composition comprising:
    a chelating agent;
    an acid;
    a member selected from the group consisting of a surfactant selected from a member of the group consisting of nonionic, catioic, anionic, and amphoteric surface active agents or a poly(oxyalkylene) condensate of an alkyl phenol.

20. The method of claim 19 where said surfactant is selected from a member of the group consisting of:
  (a) quaternary ammonium compounds including;
    (i) cationic quaternary ammonium salts based on fatty amines,
    (ii) ampnoteric quaternary ammonium salts based on fatty amines,
  (b) non-ionic surfactants of;
    (i) polyoxyethylene esters of fatty acids;
    (ii) polyoxyethylene esters of sorbitan fatty acid esters,
    (iii) monalkanolamides of fatty acids.

21. The method of claim 19 where said surfactants are quaternary ammonium compounds.

22. The method of claim 21 where said surfactants are cationic quaternary ammonium salts based on fatty amines.

23. The method of claim 22 where said surfactants are selected from a member of the group consisting of:
  (a) 1-propanaminium, N-(2-hydroxyethyl)-N,N-dimethyl-3-[(1-oxooctadecyl) amino]-salts
  (b) 1-propanaminium, N,N-trimethyl-3-[(1-oxododecyl)amino]-alkyl ester salts
  (c) 1-propanaminium,3-dodecyloxy-2-hydroxy-N-bis(2-hydroxyethyl)-N-methyl-,alkyl ester salts.

24. The method of claim 19 further comprising a fluoride salt.

25. The method of claim 19 including the following components of said composition are present in the following amounts on a molar basis:
  (a) from about 2 to about 500 parts of a chelating agent;
  (b) from 0 to about 200 parts of a fluoride salt;
  (c) from 0 to about 90 parts of a thiourea compound;
  (d) from 0 to about 0.8 parts of a surfactant;
  (e) from 0 to about 0.3 parts of poly(oxyalkylene) condensate of an alkylphenol;
  (f) from about 10 to about 180 parts of an acid;
where at least one of said components (d) or (e) is present.

26. The method of claims 3 where said catalyst is employed for applying an electrolytic coating to a non-conductive substrate and comprises:
  (a) a metal which can combine with hydrogen;
  (b) an acid;
  (c) an $Sn^{2+}$ salt;
  (d) a member selected from the group of an alkali metal stannate and an $Sn^{4+}$ salt;
  (e) a metal salt stabilizer.

27. The method of claim 26 where said metal is a Group VIII metal of the Periodic Table of the Elements.

28. The method of claim 27 where said metal is palladimm.

29. The method of claim 27 where said stabilizer is a water-soluble stable salt selected from the group consisting of the salts of magnesium, titanium, zirconium, hafnium, manganese, cobalt, nickel, silver, zinc, cadmium, aluminum, gallium, indium and thallium and mixtures thereof.

30. The method of claim 29 where said stabilizer is selected from the group consisiing of the salts of aluminum, titanium, zirconium and hafnium.

31. The method of claim 29 where said metal comprises aluminum.

32. The method of claim 29 where said metal salt comprises an aluminum halide.

33. The method of claim 26 where the components of said composition are present in the following amounts on a molar basis:
  (a) from about 0.1 to about 2 parts of said metal salt;
  (b) from about 3 to about 6 parts of said acid;
  (c) from about 4 to about 85 parts of said $Sn^{2+}$ salt;
  (d) from about 0.5 to about 10 parts of said alkali metal stannate or $Sn^{4+}$ salt;
  (e) from about 100 to about 1000 parts of said metal salt stabilizer.

34. The method of claim 3 where said metal salt is combined with:
  (a) an acid;
  (b) an adjuvant selected from the group consisting of
    (i) polyhydroxy cyclic compounds;
    (ii) acetylenic alcohols and their derivatives;
    (iii) acetylenic compounds;
    (iv) water soluble polymers and;
  (c) a halogen ion.

35. The method of claim 34 where said polyhydroxy compound comprises a cyclic polyhydroxy compound having a six carbon atom ring and from 2 to about 3 hydroxy groups on said ring and a cyclic hydroxy compound having a 6 carbon atom ring and one hydroxy group on said ring, said second cyclic hydroxy compound being present in an amount of from 0 to about 80% of said polyhydroxy compound on a molar basis.

36. The method of claim 35 where said cyclic polyhydroxy compound is selected from the group consisting of resorcinol and pyrogallol and said cyclic hydroxy compound comprises phenol.

37. The method of claim 35 where said polyhydroxy compound comprises a nitrogen heterocyclic compound having from 1 to about 2 nitrogen atoms.

38. The method of claim 35 where said hydroxy compound comprises 2,4-dihydroxy-6-methylpyrimidine.

39. The method of claim 35 where said adjuvant comprises propargyl alcohol and its derivatives.

40. The method of claim 35 where said adjuvant is a water soluble polymer.

41. The method of claim 35 where said adjuvant is a hydroxyalkylcellulose.

42. The method of claim 35 where the components of said composition are present in the following amounts on a molar basis:
  (a) from about 2.5 to about 50 parts of said metal salt
  (c) from about 0.4 to about 8 parts of said adjuvant
  (d) from about 10 to about 100 parts per million of a halide ion.

43. The method of claim 3 comprising applying said photoresist to a substrate comprising a circuit board having a metal surface and through holes, imaging and neutralizing said photoresist, forming a circuit pattern of said metal coating on said board and in said through holes, to obtain an exposed metal coating, applying an immersion tin coating to said exposed metal coating, removing said photoresist and etching said metal surface that has not been coated with said immersion tin.

* * * * *